United States Patent
Scherabon et al.

(10) Patent No.: US 9,047,548 B2
(45) Date of Patent: Jun. 2, 2015

(54) SEMICONDUCTOR CHIP, TRANSPONDER AND METHOD OF MANUFACTURING A TRANSPONDER

(75) Inventors: Christian Scherabon, Graz (AT); Anton Salfener, Pernegg (AT); Wolfgang Steinbauer, Gratkorn (AT); Joachim Heinz Schober, Graz (AT)

(73) Assignee: NXP B.V., Eindhoven (NL)

( * ) Notice: Subject to any disclaimer, the term of this patent is extended or adjusted under 35 U.S.C. 154(b) by 1685 days.

(21) Appl. No.: 12/303,705

(22) PCT Filed: May 16, 2007

(86) PCT No.: PCT/IB2007/051884
§ 371 (c)(1),
(2), (4) Date: Dec. 5, 2008

(87) PCT Pub. No.: WO2007/141686
PCT Pub. Date: Dec. 13, 2007

(65) Prior Publication Data
US 2010/0224959 A1 Sep. 9, 2010

(30) Foreign Application Priority Data

Jun. 7, 2006 (EP) .................................... 06115080

(51) Int. Cl.
*H01L 21/02* (2006.01)
*G06K 19/077* (2006.01)
(Continued)

(52) U.S. Cl.
CPC .... *G06K 19/07749* (2013.01); *G06K 19/07756* (2013.01); *H01L 23/49855* (2013.01); *H01L 23/642* (2013.01); *H01L 23/645* (2013.01); *H01L 24/06* (2013.01); *H01L 24/14* (2013.01); *H01L 24/17* (2013.01); *H01L 24/81* (2013.01); *H01L 24/83* (2013.01); *H01L 24/92* (2013.01); *H01L 2223/6677* (2013.01); *H01L 2224/0401* (2013.01); *H01L 2224/13013* (2013.01); *H01L 2224/13144* (2013.01); *H01L 2224/1403* (2013.01); *H01L 2224/17106* (2013.01); *H01L 2224/73204* (2013.01); *H01L 2224/81191* (2013.01); *H01L 2224/83851* (2013.01); *H01L 2224/9211* (2013.01); *H01L 2924/01013* (2013.01); *H01L 2924/01014* (2013.01); *H01L 2924/01033* (2013.01); *H01L 2924/01061* (2013.01); *H01L 2924/01079* (2013.01);
(Continued)

(58) Field of Classification Search
USPC .................................................. 257/532–535
See application file for complete search history.

(56) References Cited

U.S. PATENT DOCUMENTS 5,430,441 A * 7/1995 Bickley et al. ............... 340/10.2
5,854,480 A 12/1998 Noto
(Continued)

FOREIGN PATENT DOCUMENTS

| DE | 10108080 C1 | 4/2002 |
| DE | 10133588 A1 | 9/2002 |

(Continued)

*Primary Examiner* — Mark Tornow

(57) ABSTRACT

A semiconductor chip (1, 91) for a transponder (3, 93) comprises a chip substrate (4) with a surface (5), chip terminals (6, 7) arranged on the surface (5), and a passivation layer (22) covering the surface (5) and completely covering the chip terminals (6, 7), so that an antenna (2, 30) with antenna terminals (24, 25) can be attached to the chip (1, 91) above the chip terminals (6, 7), so that the chip terminals (6, 7), the passivation layer (22) and the antenna terminal (24, 25) form first capacitors.

14 Claims, 9 Drawing Sheets

(51) Int. Cl.
  *H01L 23/64* (2006.01)
  *H01L 23/00* (2006.01)
  *H01L 23/498* (2006.01)

(52) U.S. Cl.
  CPC ............ *H01L2924/19041* (2013.01); *H01L 2924/19042* (2013.01); *H01L 2924/30105* (2013.01); *H01L 2924/30107* (2013.01); *H01L 2924/01006* (2013.01); *H01L 2924/01055* (2013.01); *H01L 2224/2929* (2013.01); *H01L 2224/293* (2013.01); *H01L 2924/00011* (2013.01)

(56) References Cited

U.S. PATENT DOCUMENTS

| | | | |
|---|---|---|---|
| 5,898,403 A | 4/1999 | Saitoh et al. | |
| 6,181,287 B1 | 1/2001 | Beigel | |
| 6,190,942 B1 | 2/2001 | Wilm et al. | |
| 6,407,669 B1 | 6/2002 | Brown et al. | |
| 6,804,104 B2 | 10/2004 | Reis | |
| 6,815,809 B2 | 11/2004 | Bordes et al. | |
| 6,900,536 B1 | 5/2005 | Derbenwick et al. | |
| 7,812,343 B2 * | 10/2010 | Ullmann et al. | 257/40 |
| 2003/0042572 A1 * | 3/2003 | Detcheverry et al. | 257/533 |
| 2005/0001785 A1 * | 1/2005 | Ferguson et al. | 343/895 |
| 2005/0093090 A1 * | 5/2005 | Shindo | 257/528 |
| 2006/0027666 A1 | 2/2006 | Glaser | |

FOREIGN PATENT DOCUMENTS

| | | |
|---|---|---|
| DE | 102004034768 A1 | 2/2006 |
| WO | 0250890 A2 | 6/2002 |
| WO | 2006009934 A1 | 1/2006 |

* cited by examiner

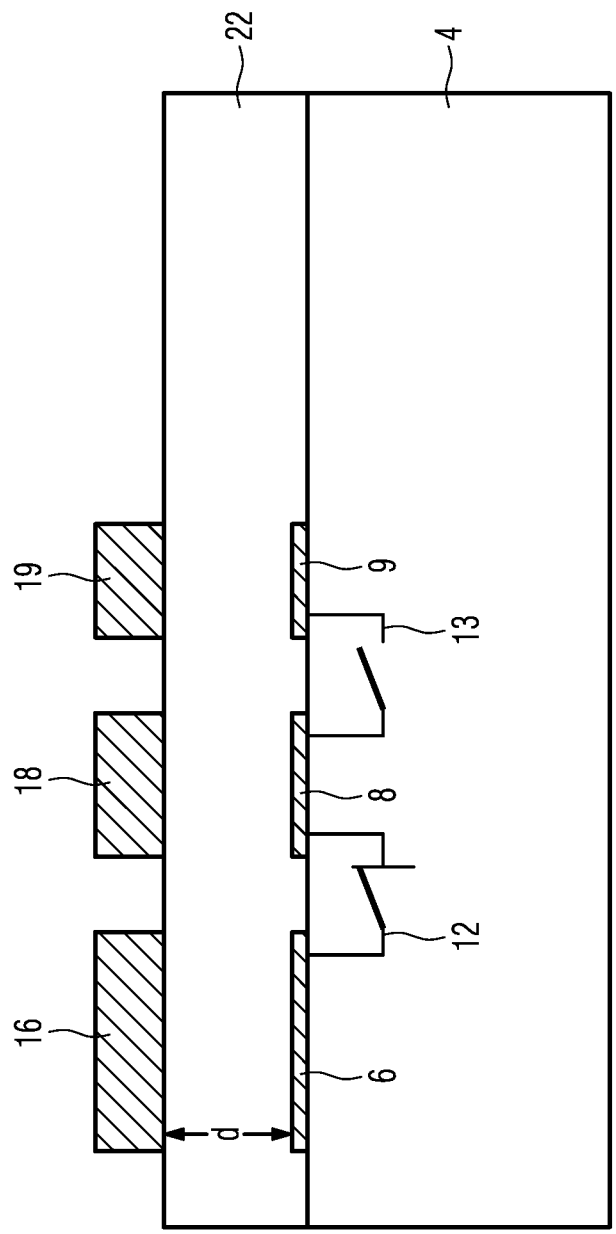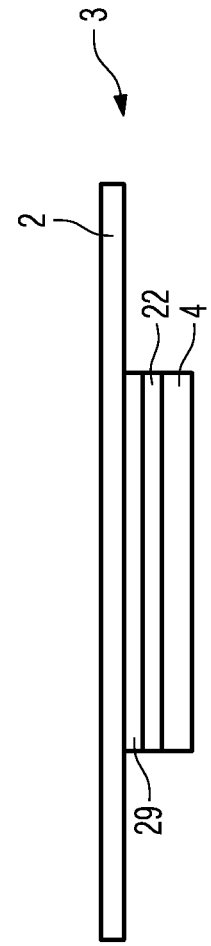
FIG. 5
FIG. 6

SEMICONDUCTOR CHIP, TRANSPONDER AND METHOD OF MANUFACTURING A TRANSPONDER

FIELD OF THE INVENTION

The invention relates to a semiconductor chip, a transponder, and to a method of manufacturing a transponder.

BACKGROUND OF THE INVENTION

Published German patent application 101 33 588 A1 discloses a semiconductor chip arranged on a chip carrier and an antenna. The chip carrier and the antenna have each conductive surfaces, which are glued together by means of a non-conductive glue layer, so that the conductive surfaces are coupled capacitively. The conductive surfaces and the intermediate non-conductive glue layer constitute capacitors whose capacitances are determined, inter alia, by the thickness of the glue layer. The glue layer, however, cannot be applied accurately within a certain thickness, resulting in varying capacitances of different chips including the antenna.

OBJECT AND SUMMARY OF THE INVENTION

It is an object of the invention to provide a semiconductor chip for a transponder whose antenna is coupled capacitively to the chip, wherein said chip is designed such that this capacitive coupling can, in a relatively simple manner, be established with a predefined capacitance having a relatively small tolerance.

A further object of the invention is to provide a corresponding method of manufacturing such a transponder.

The object of the invention is achieved by means of a semiconductor chip for a transponder, comprising a chip substrate with a surface, chip terminals arranged on the surface, and a passivation layer covering the surface and completely covering the chip terminals, so that an antenna with antenna terminals can be attached to the chip above the chip terminals, so that the chip terminals, the passivation layer and the antenna terminal form first capacitors. The inventive chip is supposed to be used in combination with an antenna to form a transponder. The antenna may capture a signal to be processed by circuitry of the chip or this circuitry may generate a signal to be emitted by the antenna. For this purpose, the antenna and the chip terminals are coupled capacitively. This coupling may be modelled by the first capacitors between the chip terminals and the antenna terminals. The corresponding capacitance depends, inter alia, on the thickness of a dielectric between the antenna terminals and the chip terminals. According to the invention, this dielectric is formed by the passivation layer covering the surface of the inventive chip and the chip terminals.

Generally, a passivation layer is a sealing layer to prevent deterioration of electric properties of the inventive semiconductor chip through chemical action, corrosion, or handling during a packing process. The passivation layer also protects the semiconductor chip against moisture or contamination. Suitable materials for a passivation layer include silicon nitride and silicon dioxide. The advantage of such a passivation layer is that it can be deposited on the substrate surface within a relatively small tolerance by well known methods. Consequently, the passivation layer can be applied on the substrate surface with a predefined thickness having a relatively small tolerance, resulting in a capacitive coupling of the chip terminal and the antenna with a predefined capacitance having a relatively small tolerance.

The passivation layer may particularly be a single homogeneous layer which partially or completely covers the substrate surface and completely covers the chip terminals. The passivation layer may also be one layer being comprised of different partial layers adjoining each other so that, for instance, one of the partial layers completely covers each chip terminal and another partial layer partially or completely covers the remaining substrate surface. Then, the material for the partial layer completely covering the chip terminals can be chosen to be especially suitable as a dielectric.

The inventive chip is meant to be combined with the antenna to form a transponder. Since the antenna and the chip terminals are coupled capacitively, the chip terminals do not need to be exposed for a galvanic coupling of the chip terminals and the antenna by, for instance, etching the passivation layer. Hence, one step in the fabrication process of the chip may be saved.

The antenna may be a loop antenna. Then conventional chips comprise necessary internal capacitors inside the semiconductor chip, which internal capacitors are connected in series to the antenna for preventing a d.c. short circuit. Since the inventive semiconductor chip is designed for a capacitive coupling between the chip and the antenna, such internal capacitors can be omitted. This may result in a reduced layout of the chip and thus a reduced chip area needed for the electronic parts.

The inventive semiconductor chip may comprise first bumps to be electrically connected to the antenna terminals. The first bumps are deposited on the passivation layer above the chip terminals. The first bumps are electrically conductive and may be made of gold. Due to the first bumps, the distance between the antenna and the chip terminals is smaller than the distance between the antenna and the remaining substrate surface. This may result in reduced stray capacitances between the chip terminals and the antenna and may reduce the tolerance of the desired capacitance between the chip terminals and the antenna. The space between the passivation layer and the antenna at areas where no bumps are deposited on the passivation layer my be filled with an appropriate underfill material.

The inventive semiconductor chip may comprise, on the surface and covered completely by the passivation layer, conductive areas, which form second capacitors with the antenna when the antenna is attached to the chip and/or which conductive areas form third capacitors with a conductive structure. The antenna and conductive areas may be formed such that the second capacitors can be connected in series and/or in parallel to the first capacitors formed by the chip terminals, the antenna terminals and the intermediate passivation layer by, for instance, electrically connecting conductive areas to the chip terminals or by interconnecting at least some of the conductive areas. The second capacitors, which may form binary stepped capacitors, can be used to tune the antenna to a desired resonance frequency. Thus, tolerances of the chip, the antenna, or the resulting capacitance during assembling of the resulting transponder may be compensated.

If the conductive areas are connected together with a conductive structure, which may be deposited on a substrate of the antenna, then these resulting third capacitors can be used, for instance, as capacitors trimming circuitry of the semiconductor chip inside the chip substrate. Thus, these capacitors may be used for an application, which is different from the antenna coupling. Advantageously, chip area may be saved because just one plate of each capacitor is indeed within the chip. The other plate is outside the chip, arranged on the, for instance, antenna substrate.

In a restricted version, the inventive semiconductor chip comprises switches for electrically connecting at least one of the conductive areas to the chip terminals or for electrically interconnecting at least some of the conductive areas. Then, the assembled transponder comprising the antenna and the inventive semiconductor chip can relatively easily be tuned by opening and closing these switches. The switches may be diode switches or transistor switches particularly integrated into the substrate.

The inventive semiconductor chip may comprise second bumps to be electrically connected to the antenna and/or the conductive structure. The second bumps are deposited on the passivation layer above the conductive areas. Then, the resulting second and/or third capacitors may be fabricated with a relatively small tolerance.

The object of the invention is also achieved by means of a transponder, comprising the inventive semiconductor chip and an antenna with antenna terminals attached to the chip above the chip terminals, so that the chip terminals, the passivation layer and the antenna terminals form the first capacitors. The antenna terminals may be electrically connected to the first bumps and/or the antenna may be electrically connected to the second bumps. Then, the resulting capacitance at the respective chip terminals are determined by the combination of the first and second capacitors, which may particularly be connected in series and/or in parallel to the first capacitors.

The antenna may be attached to the passivation layer by means of a conductive or a non-conductive glue. The conductive glue assures a good electrical contact between the antenna and the bumps.

The antenna may be inductive, has an inductance, or may comprise an additional inductance, so that a resulting resonance frequency of the inductance in combination with the first and second capacitors results in a resonance frequency. This resonance frequency may be tunable by establishing electrical connections between the chip terminals and the conductive areas and/or by breaking the antenna structure of the antenna, which antenna structure connects the second bumps.

The object of the invention is also achieved by means of a method of manufacturing a transponder, the method comprising the steps of:

depositing a passivation layer on a surface of a chip substrate; the surface comprising chip terminals and the passivation layer covering the surface and completely covering the chip terminals; and attaching, to the passivation layer at least indirectly, antenna terminals of an antenna above the chip terminals, so that the chip terminals, the antenna terminals, and the passivation layer form first capacitors.

The inventive method may comprise, before attaching the antenna terminals to the passivation layer, the following steps:

depositing conductive areas on the surface;

depositing the passivation layer on the surface of the chip substrate, so that the passivation layer covers the surface, the chip terminals, and the conductive areas;

depositing first bumps on the passivation layer, above the chip terminals, depositing second bumps on the passivation layer, above the conductive areas; and electrically connecting the first bumps to the antenna terminals and the second bumps to the antenna.

BRIEF DESCRIPTION OF THE DRAWINGS

The invention will be described in greater detail hereinafter, by way of non-limiting examples, with reference to the embodiments shown in the drawings.

FIGS. 1 to 5 are different steps illustrating the fabrication of a first exemplary embodiment of an inventive semiconductor chip;

FIGS. 6, 7 are cross-sectional views of a first exemplary embodiment of an inventive transponder comprising the semiconductor chip of FIGS. 1 to 5 and an antenna;

DESCRIPTION OF EMBODIMENTS

Figure 2:
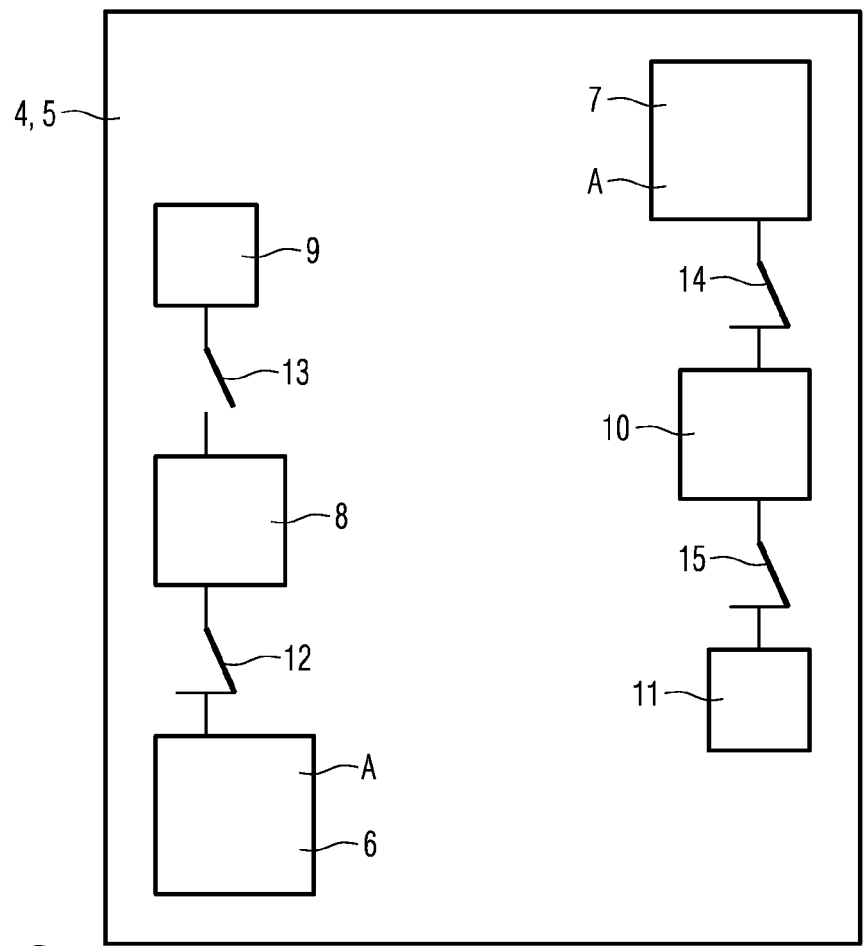
Figure 3:
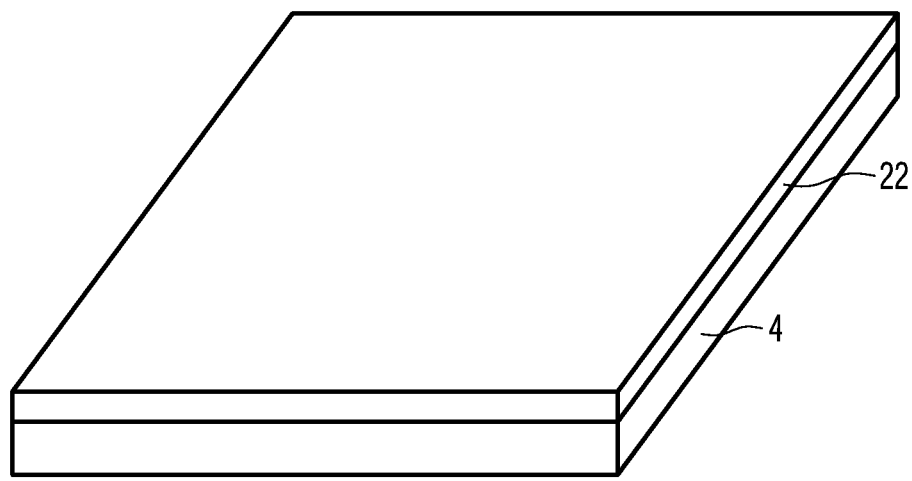
Figure 4:
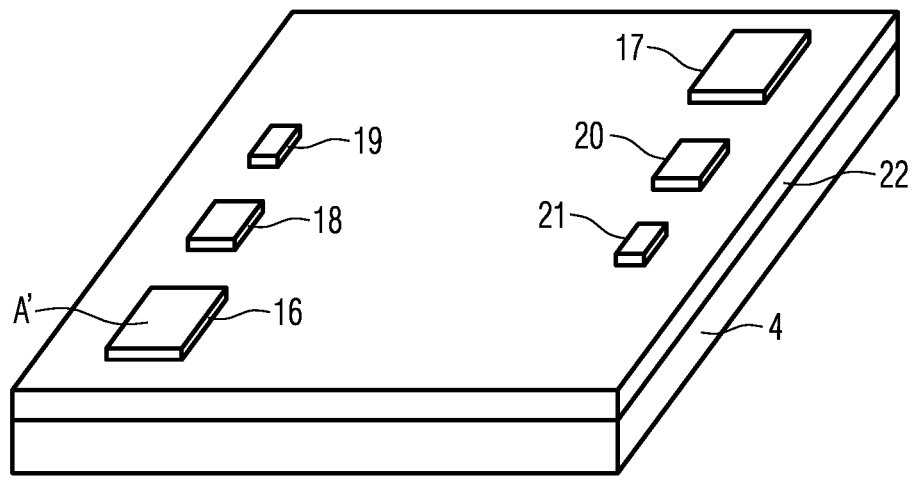
Figure 7:
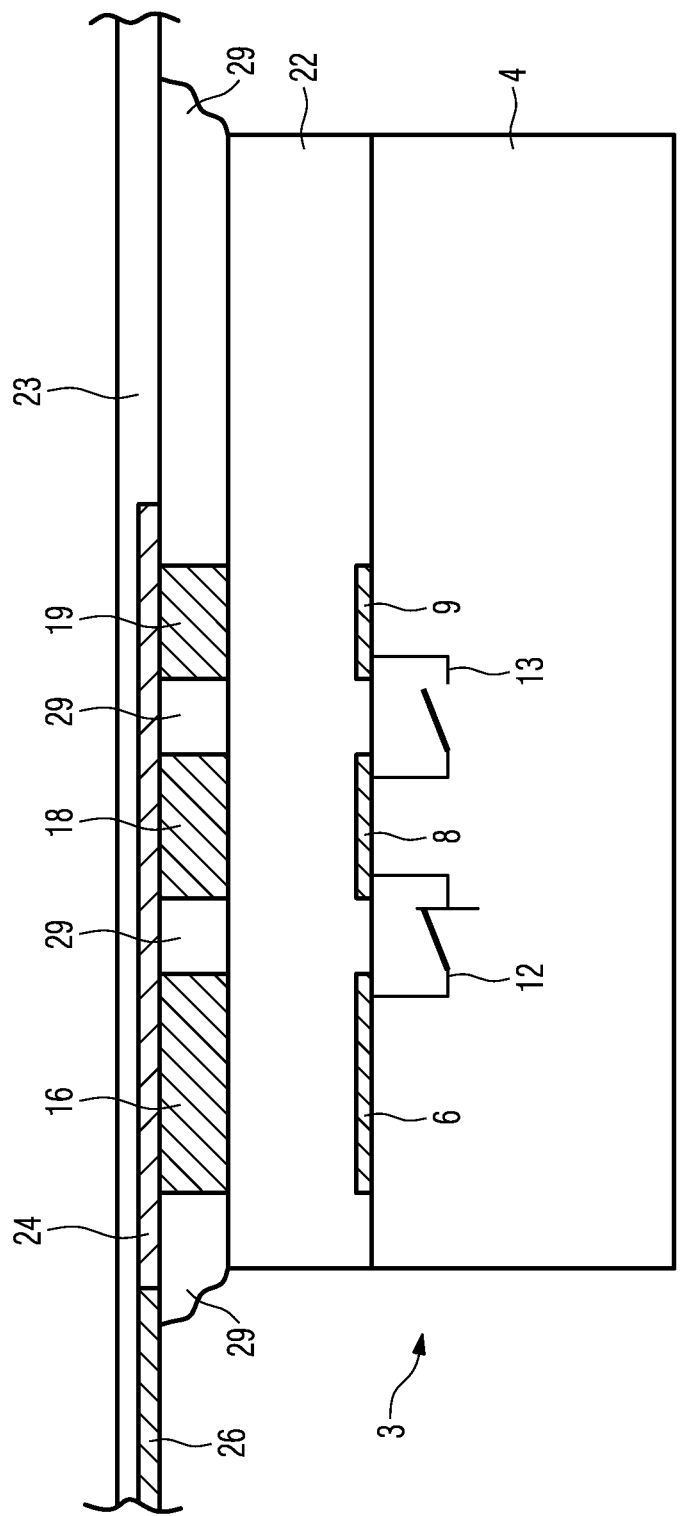
Figure 8:
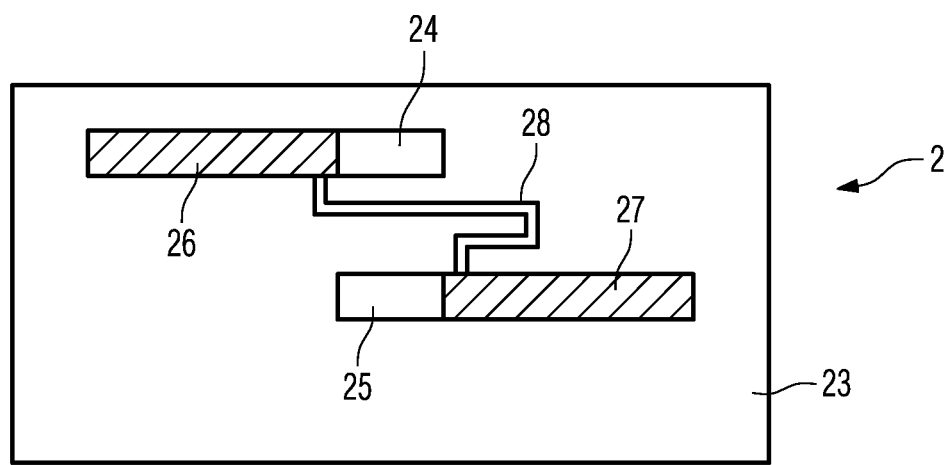
FIG. 8 is a top view of the antenna of the transponder of FIGS. 6 and 7.

FIGS. 1 to 5 show steps for manufacturing a semiconductor chip 1, which is to be combined with an antenna 2 to a transponder 3 shown in FIGS. 6 and 7. The finished semiconductor chip 1 is depicted in FIGS. 4 and 5 and a top view of the antenna 2 is shown in FIG. 8.

Figure 1:
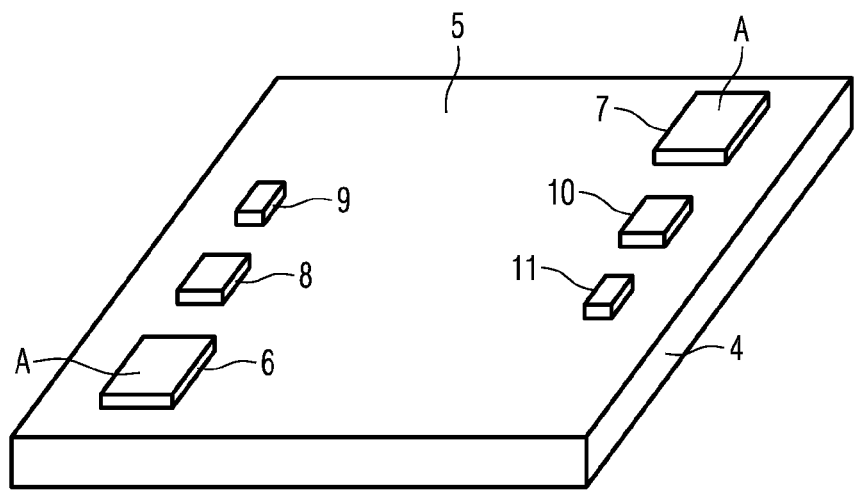

The semiconductor chip 1 comprises a chip substrate 4 with a substrate surface 5. The chip substrate 4 includes, as is commonly known, circuitry not shown in the Figures. When the transponder 3 is finished, then the circuitry of the semiconductor chip 1 is coupled capacitively to the antenna 2 via a first chip terminal 6 and a second chip terminal 7. The chip terminals 6, 7 are arranged on the substrate surface 5 of the chip substrate 4 and have each a rectangular area A for the exemplary embodiment, as is shown in FIGS. 1 and 2, wherein FIG. 2 is a top view of the semiconductor chip 1 at the fabrication step of FIG. 1.

For the exemplary embodiment, the semiconductor chip 1 comprises a first conductive area 8, a second conductive area 9, a third conductive area 10 and a fourth conductive area 11, which all are deposited on the substrate surface 5 by well known deposition techniques. The first and third conductive areas 8, 10 have each a rectangular shape and are smaller than the areas A of the first and second chip terminals 6, 7. The second and fourth conductive areas 9, 11 have each a rectangular shape and are smaller than the first and third conductive areas 8, 10, as is evident from FIG. 2.

For the exemplary embodiment, the first chip terminal 6 and the first conductive area 8 can be electrically connected by a first switch 12, the first conductive area 8 and the second conductive area 9 can be electrically connected by a second switch 13, the second chip terminal 7 and the third conductive area 10 can be electrically connected by a third switch 14, and the third conductive area 10 and the fourth conductive area 11 can be electrically connected by a fourth switch 15. The switches 12 to 15 are integrated within the chip substrate 4 and are based on transistor technology for the exemplary embodiment.

In a further fabrication step, a passivation layer 22 is deposited on the substrate surface 5 completely covering the chip terminals 6, 7 and the conductive areas 8-11, as is shown in FIG. 3. The passivation layer 22 is a sealing layer to prevent deterioration of electric properties of the semiconductor chip 1 through chemical action, corrosion, or handling during a packing process. The passivation layer 22 also protects the semiconductor chip 1 against moisture or contamination. For the exemplary embodiment, the passivation layer 22 is a layer of silicon nitride and is about 900 nm thick. Another suitable material for the passivation layer 22 is, for instance, silicon dioxide.

After that, a first bump 16 is deposited on the passivation layer 22 directly above the first chip terminal 6, as is shown in FIG. 4 and in FIG. 5, which is a cross-sectional view of the semiconductor chip 1. For the exemplary embodiment, the first bump 16 is made of gold, has an rectangular area A' substantially equal to the area A of the first chip terminal 6 and forms, together with the first chip terminal 6 and the intermediate passivation layer 22, a first capacitor having the capacitance, $C_1$, of:

$$C_1 = \frac{\varepsilon_0 \cdot \varepsilon_r \cdot A}{d}$$

wherein $\varepsilon_0$ is the permittivity of free space which equals approximately $8.8541878176 \times 10^{-12}$ F/m, $\varepsilon_r$ is the relative permittivity of the material of the passivation layer 22 and equals approximately 4 for the exemplary embodiment, and d is the distance between the first chip terminal 6 and the first bump 16. The distance d is 900 nm and the areas A and A' of the first chip terminal 6 and the first bump 16, respectively, are 3600 pm² (square-picometer) for the exemplary embodiment. Thus, the capacitance $C_1$ is approximately 142 fF (Femto-Farad).

For the exemplary embodiment, a second bump 17 made of gold is deposited on the passivation layer 22 directly above the second chip terminal 7. The second bump 17 is also square-shaped and has an area A' substantially equal to the areas A of the first and second chip terminals 6, 7. The second bump 17 is spaced apart from the second chip terminal 7 by the same distance d and forms, with the second chip terminal 7 and the intermediate passivation layer 22, a second capacitor with the capacitance $C_2$, which also equals approximately 142 fF (Femto-Farad).

For the exemplary embodiment, the semiconductor chip 1 comprises a third bump 18, which is made of gold and is deposited on the passivation layer 22 directly above the first conductive area 8, a fourth bump 19, which is made of gold and is deposited on the passivation layer 22 directly above the second conductive area 9, a fifth bump 20, which is made of gold and is deposited on the passivation layer 22 directly above the third conductive area 10, and a sixth bump 21, which is made of gold and is deposited on the passivation layer 22 directly above the fourth conductive area 11. The respective third to sixth bumps 18-21 have areas corresponding to the respective first to fourth conductive areas 8-11. The first conductive area 8, the third bump 18 and the intermediate passivation layer 22 form a third capacitor, whose capacitance $C_3$ is smaller than the capacitance $C_1$ or $C_2$. The second conductive area 9, the fourth bump 19 and the intermediate passivation layer 22 form a fourth capacitor, whose capacitance $C_4$ is smaller than the capacitance $C_3$. The third conductive area 10, the fifth bump 20 and the intermediate passivation layer 22 form a fifth capacitor, whose capacitance $C_5$ approximately equals the capacitance $C_3$ and the fourth conductive area 11, the sixth bump 21 and the intermediate passivation layer 22 form a sixth capacitor whose capacitance $C_6$ approximately equals the capacitance $C_4$.

The semiconductor chip 1 is meant to be combined with the antenna 2 to the transponder 3, which is depicted in FIGS. 6 and 7 in a cross-sectional view.

FIG. 8 shows the antenna 2 in a top view. For the exemplary embodiment, the antenna 2 is a dipole antenna, comprised of a first conductive trace 26 and a second conductive trace 27 made of metal. One end of the first conductive trace 26 is a first antenna terminal 24 and one end of the second conductive trace 27 is a second antenna terminal 25. The conductive traces 26, 27 are attached to an antenna substrate 23 for the exemplary embodiment, as is commonly known in the art. The antenna substrate 23 is, for instance, a plastic sheet. Additionally, the conductive trances 26, 27 are connected by a conductive loop 28 made of metal and attached to the substrate 23 for the exemplary embodiment. The conductive loop has an inductance L.

In order to obtain the transponder 3, the antenna 2 is attached to the passivation layer 22 such that the first antenna terminal 24 touches the first, third and fourth bumps 16, 18, 19, and the second antenna terminal 25 touches the second, fifth, and sixth bumps 17, 20, 21. Additionally, the antenna substrate 23 with the conductive traces 26, 27 and the conductive loop 28 are fixed to the semiconductor chip 1 by means of a glue which forms a glue layer 29. For the exemplary embodiment, the glue comprises conductive particles (e.g. conductive balls in a non conductive gluey material), so that an electrical contact is established between the bumps 16-21 when the antenna substrate 23 is pressed against the passivation layer 22 and the bumps 16-21. As a result, the first, third, and fourth bumps 16, 18, 19 are connected in series by the first conductive trace 26, as is shown in FIG. 8, and the second, fifth, and sixth bumps 17, 20, 21 are also connected in series by the second conductive trace 27 for the exemplary embodiment. In areas where the glue is less compressed (i.e. in the gaps between the bumps 16-21), the conductive particles do not form a conductive chain. The great advantage is that filling the gaps between the bumps 16-21 and attaching the antenna substrate 23 to the chip 1 may be performed in one single process step. However, it is also imaginable to use a non-conductive glue for the glue layer 29. In this case the antenna terminals 24, 25 are capacitively coupled to the bumps 16-21. Finally, apart from the embodiment as explained, a non-conductive underfill material may be applied to the gaps between the bumps 16-21 after the fabrication of the bumps 16-21, so that an even surface is obtained. Afterwards, the antenna substrate 23 is joined to the chip 1 by means of a conductive glue, which then forms a comparable thin layer between said surface and the antenna substrate 23 and said surface and the antenna terminals 24, 25 (not shown in Figs.) respectively.

As mentioned above, the semiconductor chip 1 comprises switches 12-15 for electrically connecting the chip terminals 6, 7 to the third and fifth conductive areas 8, 10 and for electrically connecting the third and fifth conductive areas 8, 10 to the fifth and sixth conductive areas 9, 11. Consequently, by appropriately closing the first and second switches 12, 13, a resulting capacitance, $C_{1,res}$ at the first antenna terminal 24 can be adjusted. For example, if the first switch 12 is closed and the second switch 13 is open, as is illustrated in FIG. 2, FIG. 5, and FIG. 7, then the resulting capacitance, $C_{1,res}$ at the first antenna terminal 24 equals:

$$C_{1,res} = \frac{C_1 \cdot C_3}{C_1 + C_3}$$

The resulting capacitance, $C_{2,res}$ at the second antenna terminal 25 can be adjusted by appropriately closing the third and fourth switches 14, 15. In the example shown in FIG. 2, the third and fourth switches 14, 15 are closed so, that the resulting capacitance, $C_{2,res}$ at the second antenna terminal 25 can be calculated according to:

$$\frac{1}{C_{2,res}} = \frac{1}{C_2} + \frac{1}{C_5} + \frac{1}{C_6}$$

Figure 9:
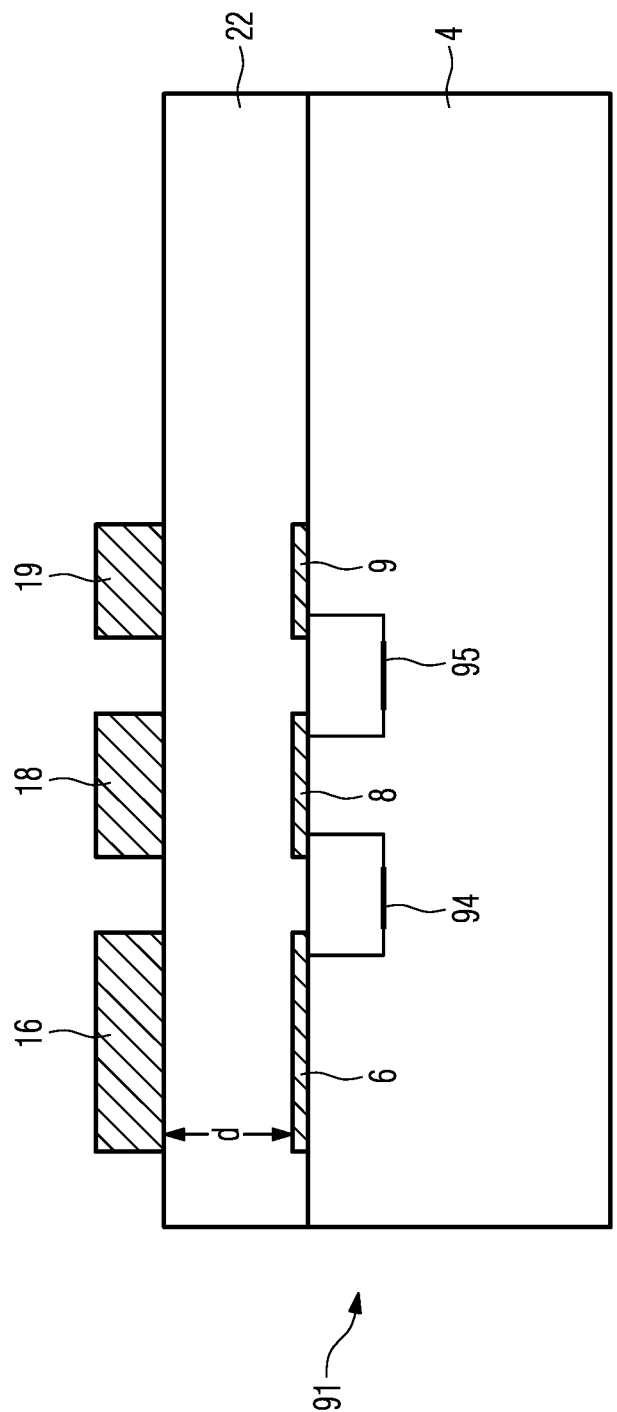
FIG. 9 is a cross-sectional view of a second exemplary embodiment of an inventive semiconductor chip.
Figure 10:
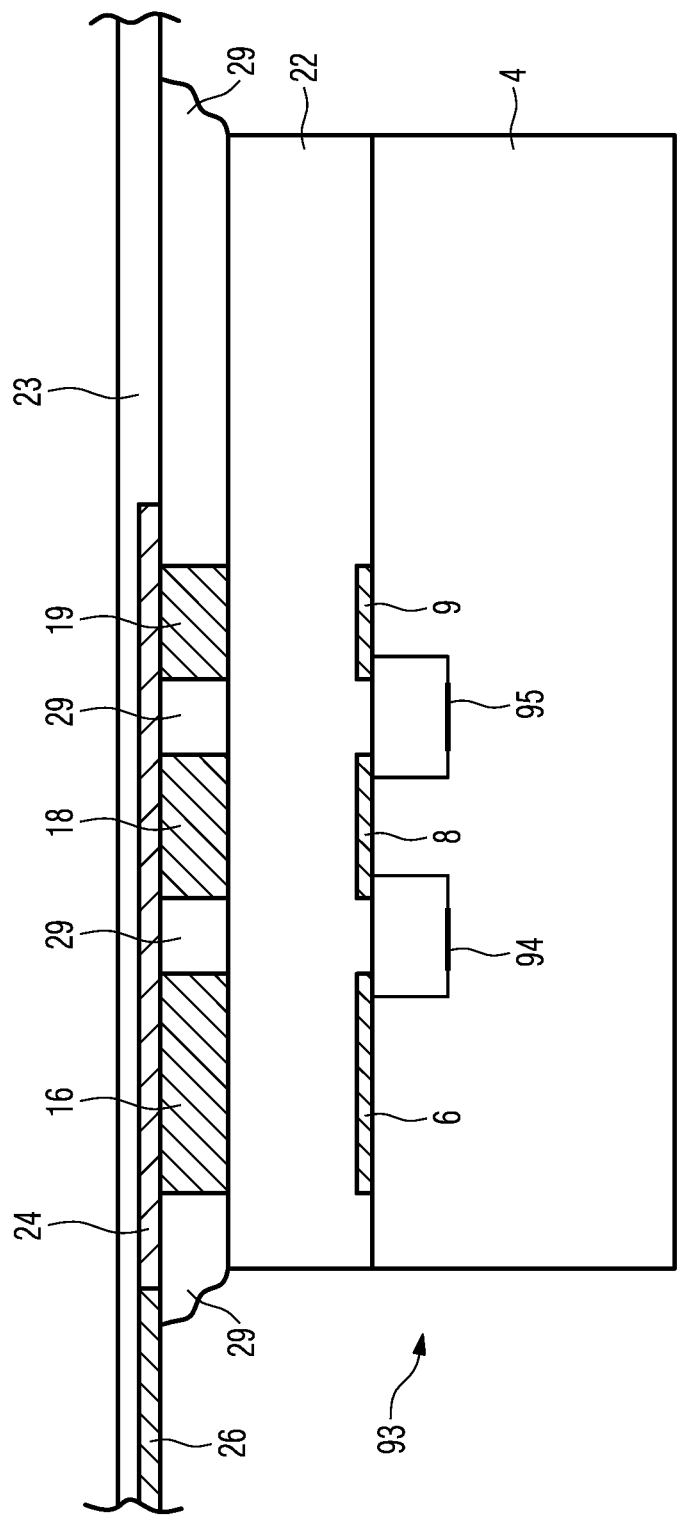
FIGS. 10, 11 are cross-sectional views of a second exemplary embodiment of an inventive transponder comprising the semiconductor chip of FIG. 9.
Figure 11:
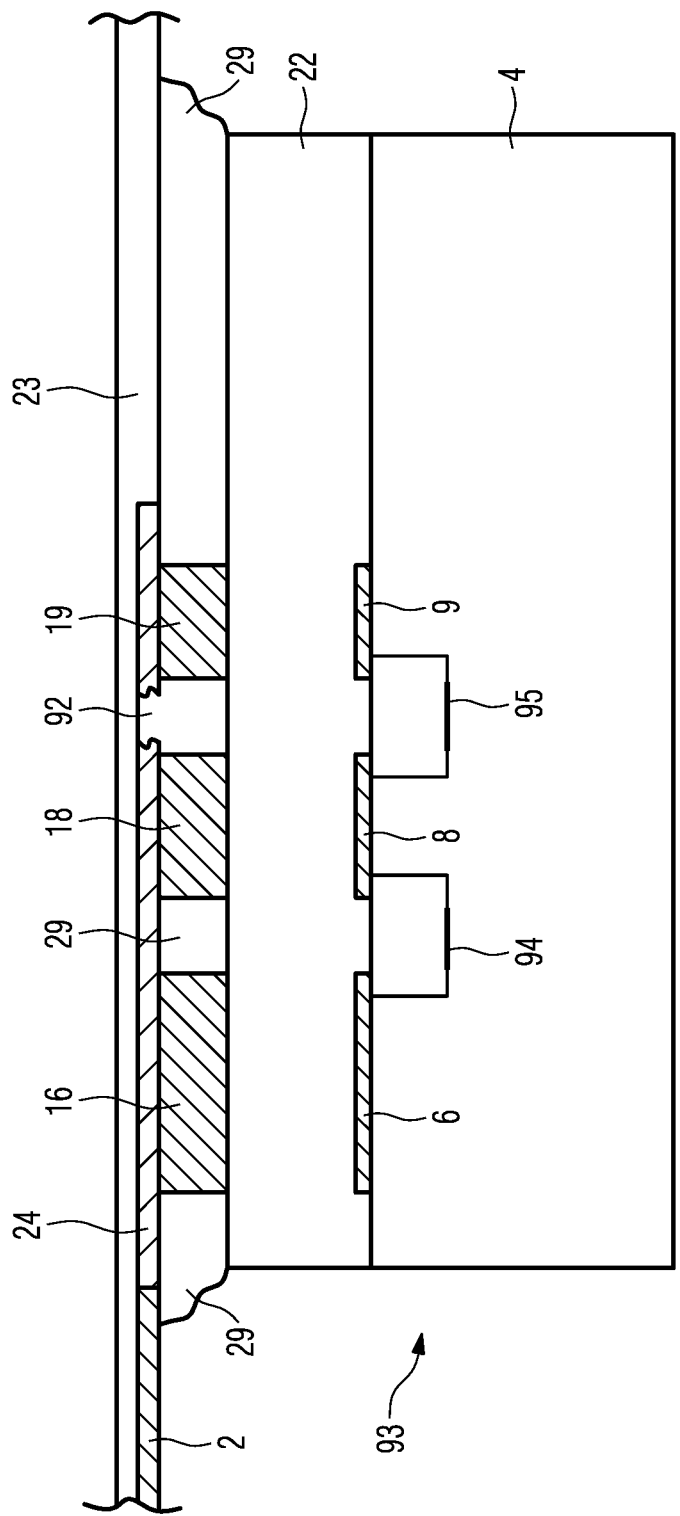

FIG. 9 shows a second exemplary embodiment of a semiconductor chip 91, which can be combined with the antenna 2 to a second exemplary embodiment of a transponder 93 whose cross-sectional view is shown in FIGS. 10 and 11. If not especially stated, then components of the semiconductor chip 91 and components of the transponder 93 are denoted by the same reference signs as components of the semiconductor chip 1 and the transponder 3.

Compared to the semiconductor chip 1 of FIG. 4, the semiconductor chip 91 of FIG. 9 does not comprise the switches 12-15. Instead, the chip terminals 6, 7 and the conductive areas 8-11 are permanently interconnected by connectors. FIG. 9 shows only a connector 94 electrically connecting the first chip terminal 6 to the first conductive area 8 and a connector 95 electrically connecting the first conductive area 8 to the second conductive area 9. Thus, the resulting capacitances, $C_{1,res}$, $C_{2,res}$ at the antenna terminals 24, 25 of the transponder 93 can be calculated according to:

$$\frac{1}{C_{1,res}} = \frac{1}{C_1} + \frac{1}{C_3} + \frac{1}{C_4}$$

$$\frac{1}{C_{2,res}} = \frac{1}{C_2} + \frac{1}{C_5} + \frac{1}{C_6}$$

In order to adjust the resulting capacitances, $C_{1,res}$, $C_{2,res}$ at the antenna terminals 24, 25 of the transponder 93, the conductive traces 26, 27 of the antenna 2 can be broken at predefined locations to break a connection between two bumps. FIG. 11 shows an example where the conductive trace 26 is broken at a location 92 between the third and fourth bumps 18, 19, so that the resulting capacitance, $C_{1,res}$, at the first antenna terminal 24 equals:

$$C_{1,res} = \frac{C_1 \cdot C_3}{C_1 + C_3}$$

The antenna 2 of the exemplary embodiments described is a dipole antenna. The invention is, however, not restricted to such antenna structures and other antenna structures are within the scope of the invention. The described capacitors $C_1$ to $C_5$ are connected in series for the exemplary embodiments described. The bumps or the antenna structure can also be designed in such a way that these capacitors are connected in parallel or as a combination of the two.

Although, the embodiment shown just allows to change the capacitance by discrete steps, one skilled in the art can easily imagine that by forming one plate of a capacitor on the chip substrate 4 and the second plate on the antenna substrate 23, the capacitance can be changed continuously by partly taking away said second plate or by just dividing said second plate into two parts at an arbitrary location, e.g. by means of a laser. By doing so, the change of the capacitance is not limited to discrete steps, that is to say just limited to the resolution of the removing or dividing process.

Figure 12:
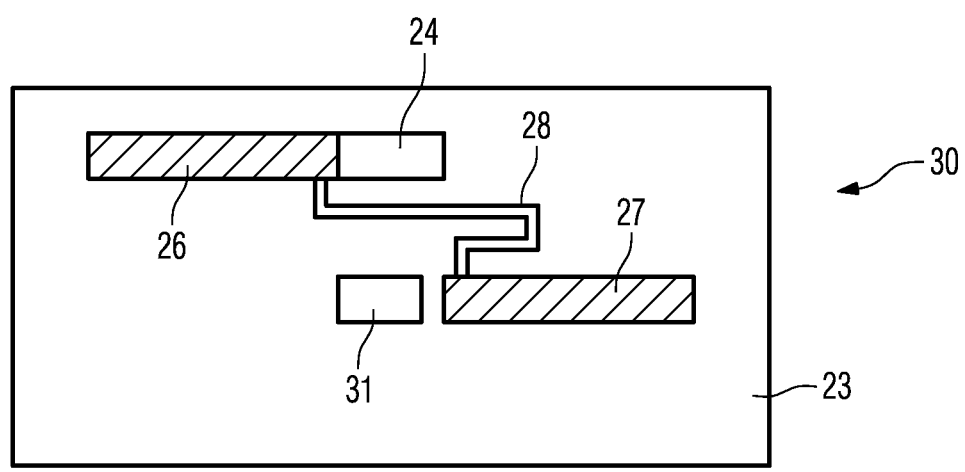
FIG. 12 is a top view of a further antenna.

FIG. 12 shows a further exemplary embodiment of an antenna 30. If not especially stated, then components of the antenna 30 are denoted by the same reference signs as components of the antenna 2. The antenna 30 is also a dipole antenna. Compared to the antenna 2, the bumps 20, 21 are not connected by the second conductive trace 27, but by a third conductive trace 31. The corresponding capacitors $C_5$ and $C_6$ are connected to the circuitry of the semiconductor chips 1, 91, in order to trim this circuitry.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transponder, comprising:
    a semiconductor chip, the chip comprising:
        a chip substrate with a surface;
        chip terminals arranged on said surface; and
        a passivation layer having a first side and an opposite second side, wherein the first side of the passivation layer is in contact with said surface and said chip terminals, the passivation layer completely covering said chip terminals, and the opposite second side of the passivation layer provides an exposed exterior surface of the semiconductor chip; and
    an antenna with antenna terminals attached to the second side of the passivation layer of said chip above said chip terminals, so that said chip terminals, said passivation layer and said antenna terminals form first capacitors to capacitively couple the antenna and the chip terminals.

2. The transponder of claim 1, further comprising conductive bumps disposed on the second side of the passivation layer of the semiconductor chip, wherein said antenna terminals are electrically connected to said bumps to attach the antenna terminals to the second side of the passivation layer at locations corresponding to the chip terminals.

3. The transponder of claim 1, wherein said antenna is attached to said passivation layer by means of a conductive glue.

4. The transponder of claim 1, further comprising:
    additional conductive areas disposed on the second side of the passivation layer of the semiconductor chip;
    an antenna substrate on which the antenna is formed; and
    conductive structures deposited on the antenna substrate at locations corresponding to the additional conductive areas, wherein the additional conductive areas, the passivation layer, and the conductive structures form third capacitors.

5. A method of manufacturing a transponder, the method comprising:
    depositing chip terminals on a chip substrate of a semiconductor chip;
    depositing a passivation layer on a surface of the chip substrate, wherein the passivation layer has a first side and an opposite second side, wherein the first side of the passivation layer is in contact with the surface and the chip terminals, the passivation layer completely covering said surface and covering said chip terminals, and the opposite second side of the passivation layer provides an exposed exterior surface of the semiconductor chip; and attaching antenna terminals of an antenna to the opposite second side of the passivation layer above said chip terminals, wherein said chip terminals, said antenna terminals, and said passivation layer constitute first capacitors to capacitively couple the antenna to the chip terminals.

6. The method of claim 5, further comprising attaching said antenna terminals to said passivation layer by depositing, on the second side of said passivation layer, bumps above said chip terminals; and electrically connecting said bumps to said antenna terminals.

7. The method of claim 5, further comprising attaching said antenna terminals to said passivation layer by:
 depositing conductive areas on said surface;
 depositing said passivation layer on said surface of said chip substrate, so that said passivation layer covers said conductive areas;
 depositing first bumps on the second side of said passivation layer, above said chip terminals;
 depositing second bumps on said passivation layer, above said conductive areas; and
 electrically connecting said first and second bumps to said antenna terminals.

8. The transponder of claim 1, wherein said antenna is attached to said passivation layer by means of a non-conductive glue.

9. The transponder of claim 1, wherein the chip further comprises additional conductive areas arranged on the surface of the chip relative to the chip terminals, and the transponder further comprises additional conductive bumps disposed on the second side of the passivation layer of the semiconductor chip at locations corresponding to the additional conductive areas, wherein the additional conductive areas, the passivation layer, and the additional conductive bumps form second capacitors.

10. The transponder of claim 9, wherein the second capacitors comprise stepped binary capacitors to tune the antenna to a desired resonance frequency.

11. The transponder of claim 9, wherein the antenna terminals are electrically connected to the additional conductive bumps so that each antenna terminal is connected to at least two conductive bumps.

12. The transponder of claim 9, wherein at least one of the additional conductive areas is electrically connected to one of the chip terminals by one or more dedicated electrical connections within the chip substrate.

13. The transponder of claim 12, wherein the one or more dedicated electrical connections within the chip substrate comprise switches operable to connect and disconnect the additional conductive areas to the corresponding chip terminal.

14. The transponder of claim 12, wherein the third capacitors comprise trimming circuitry from the semiconductor chip.

* * * * *